(12) United States Patent
Terashima et al.

(10) Patent No.: US 9,024,442 B2
(45) Date of Patent: May 5, 2015

(54) SOLDER BALL FOR SEMICONDUCTOR PACKAGING AND ELECTRONIC MEMBER USING THE SAME

(75) Inventors: Shinichi Terashima, Tokyo (JP); Masamoto Tanaka, Tokyo (JP); Katsuichi Kimura, Saitama (JP)

(73) Assignees: Nippon Steel & Sumikin Materials Co., Ltd., Tokyo (JP); Nippon Micrometal Corporation, Saitama (JP)

( * ) Notice: Subject to any disclaimer, the term of this patent is extended or adjusted under 35 U.S.C. 154(b) by 171 days.

(21) Appl. No.: 13/508,864

(22) PCT Filed: Aug. 4, 2011

(86) PCT No.: PCT/JP2011/067851
§ 371 (c)(1),
(2), (4) Date: May 9, 2012

(87) PCT Pub. No.: WO2012/023440
PCT Pub. Date: Feb. 23, 2012

(65) Prior Publication Data
US 2012/0223430 A1    Sep. 6, 2012

(30) Foreign Application Priority Data
Aug. 18, 2010 (JP) .................................. 2010-182934

(51) Int. Cl.
H01L 23/48 (2006.01)
H01L 23/52 (2006.01)
H01L 29/40 (2006.01)
B23K 35/26 (2006.01)
C22C 13/00 (2006.01)
H01L 23/00 (2006.01)
H01L 23/498 (2006.01)
H01L 23/31 (2006.01)
H05K 3/34 (2006.01)

(52) U.S. Cl.
CPC .............. *B23K 35/262* (2013.01); *C22C 13/00* (2013.01); *H01L 23/3114* (2013.01); *H01L 24/13* (2013.01); *H01L 24/81* (2013.01); *H01L 2224/0401* (2013.01); *H01L 2224/05082* (2013.01); *H01L 2224/05083* (2013.01); *H01L 2224/11334* (2013.01); *H01L 2224/13099* (2013.01); *H01L 2224/13111* (2013.01); *H01L 2224/13688* (2013.01); *H01L 2224/81801* (2013.01); *H01L 2924/01004* (2013.01); *H01L 2924/01012* (2013.01); *H01L 2924/01013* (2013.01); *H01L 2924/01025* (2013.01); *H01L 2924/01029* (2013.01); *H01L 2924/0103* (2013.01); *H01L 2924/01049* (2013.01); *H01L 2924/01051* (2013.01); *H01L 2924/01057* (2013.01); *H01L 2924/01058* (2013.01); *H01L 2924/01079* (2013.01); *H01L 2924/01082* (2013.01); *H01L 2924/351* (2013.01); *H01L 2924/3512* (2013.01); *H01L 2924/3651* (2013.01); *H01L 2924/37* (2013.01); *H05K 3/3436* (2013.01); *H05K 3/3463* (2013.01); *H05K 2203/041* (2013.01); *H01L 2924/01006* (2013.01); *H01L 2924/01033* (2013.01); *H01L 2924/01047* (2013.01); *H01L 2924/01074* (2013.01); *H01L 2924/01322* (2013.01); *H01L 2924/014* (2013.01); *H01L 2224/13005* (2013.01); *H01L 2924/01327* (2013.01); *H01L 2924/00013* (2013.01); *H01L 23/49816* (2013.01); *H01L 23/49866* (2013.01); *H01L 2924/10253* (2013.01)

(58) Field of Classification Search
USPC ............................ 257/738, E23.023, 779, 780
See application file for complete search history.

(56) References Cited

U.S. PATENT DOCUMENTS

| | | | |
|---|---|---|---|
| 2007/0243098 A1 | 10/2007 | Ohnishi et al. | |
| 2009/0232696 A1* | 9/2009 | Ohnishi et al. | 420/561 |
| 2009/0274573 A1* | 11/2009 | Miyanishi et al. | 420/84 |
| 2011/0089224 A1* | 4/2011 | Ohnishi et al. | 228/180.1 |

FOREIGN PATENT DOCUMENTS

| | | |
|---|---|---|
| JP | 2003-001481 A | 1/2003 |
| JP | 2004-001100 A | 1/2004 |
| JP | 2005-254298 A | 9/2005 |
| JP | 2009-248156 A | 10/2009 |
| WO | 2006/011204 A1 | 2/2006 |
| WO | 2006011204 A1 | 2/2006 |
| WO | 2009/051240 A1 | 4/2009 |
| WO | 2009051240 A1 | 4/2009 |

OTHER PUBLICATIONS

Japanese Office with English translation issued in Japanese Application No. 2011-547624 dated Jul. 23, 2013.

* cited by examiner

*Primary Examiner* — Khiem D Nguyen
*Assistant Examiner* — Wilner Jean Baptiste
(74) *Attorney, Agent, or Firm* — Troutman Sanders LLP

(57) ABSTRACT

The present invention relates to a solder ball for semiconductor packaging and an electronic member having such solder ball. Specifically there are provided: a solder ball capable of ensuring a sufficient thermal fatigue property even when a diameter thereof is not larger than 250 μm as observed in recent years; and an electronic member having such solder ball. More specifically, there are provided: a solder ball for semiconductor packaging that is made of a solder alloy containing Sn as a main element, 0.1-2.5% Ag by mass, 0.1-1.5% Cu by mass and at least one of Mg, Al and Zn in a total amount of 0.0001-0.005% by mass, such solder ball having a surface including a noncrystalline phase that has a thickness of 1-50 nm and contains at least one of Mg, Al and Zn, O and Sn, and an electronic member having such solder ball.

10 Claims, 1 Drawing Sheet

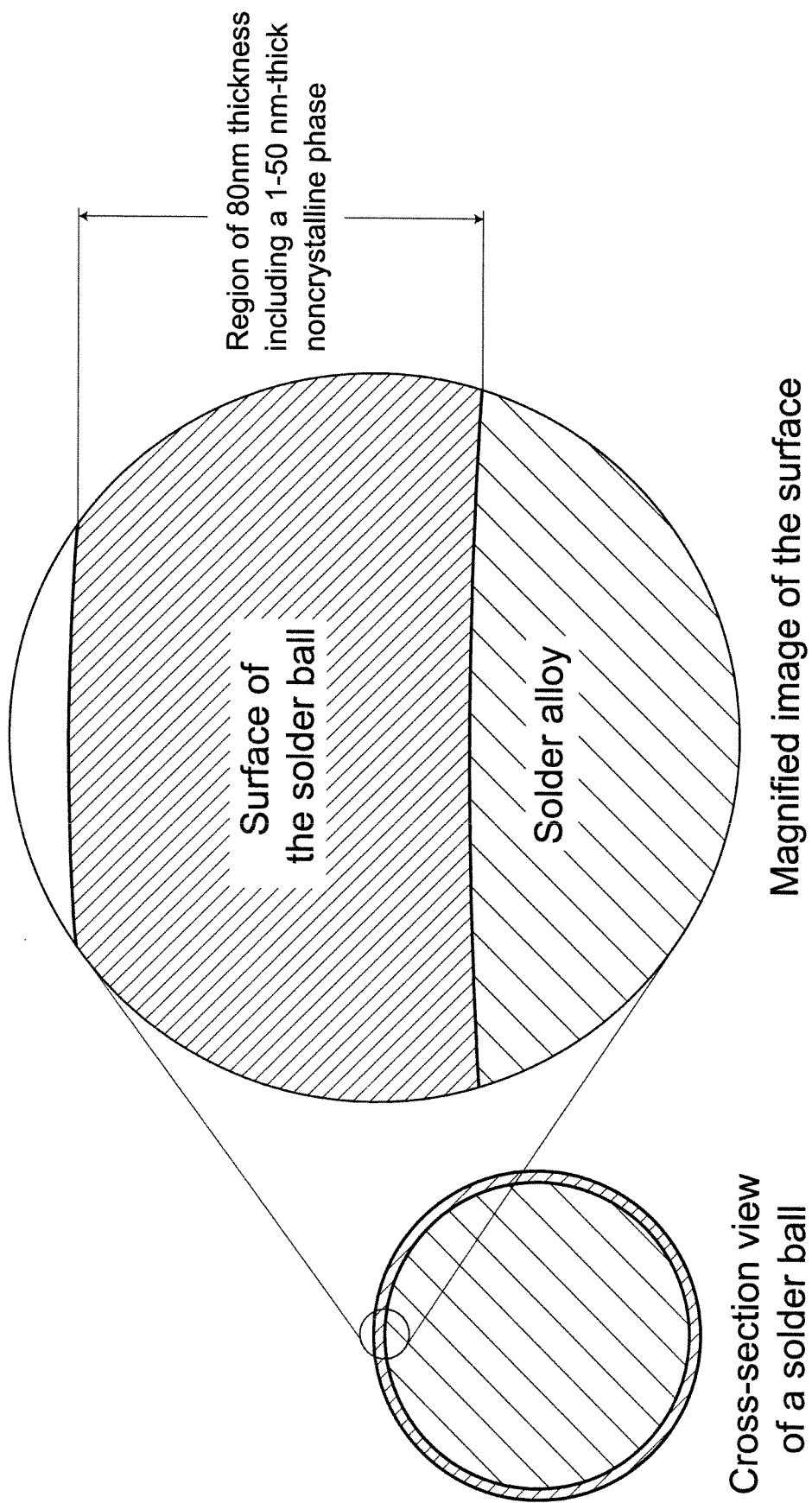

SOLDER BALL FOR SEMICONDUCTOR PACKAGING AND ELECTRONIC MEMBER USING THE SAME

CROSS REFERENCE TO PRIOR APPLICATIONS

This application is a U.S. National Phase application under 35 U.S.C. §371 of International Application No. PCT/JP2011/067,851, filed on Aug. 4, 2011 and claims benefit of priority to Japanese Patent Application No. 2010-182934, filed on Aug. 18, 2010. The International Application was published in Japanese on Feb. 23, 2012 as WO 2012/023440 A1 under PCT Article 21(2). All these applications are herein incorporated by reference.

TECHNICAL FIELD

The present invention relates to a solder ball for semiconductor packaging and an electronic member employing the corresponding solder ball.

BACKGROUND ART

An electronic component is mounted on a printed circuit board or the like. In general, the electronic component is mounted through a so-called reflow method. Particularly, the electronic component and the printed circuit board or the like are at first temporarily bonded to each other with solder balls for semiconductor packaging (referred to as "solder balls" hereunder) and a flux provided therebetween. Next, the entire printed circuit board is heated so as to melt the solder balls, followed by cooling the corresponding printed circuit board to a normal temperature so as to solidify the solder balls, thus ensuring solid solder-bonded sections.

It has been increasingly required that a solder alloy used as a connection material in an electronic device be made lead-free so that a negative impact on the environment may be minimized when disposing the corresponding electronic device. Accordingly, as a composition of a solder bail, there are extensively used, for example, an Sn—Ag eutectic composition (Ag: 3.5% by mass, Sn: remainder), and a solder composition disclosed in Patent documents 1 and 2 in which a small amount of Cu serving as a third element is added to the aforementioned Sn—Ag eutectic composition. Further, a solder ball having a composition similar to that described above is mainly used also in a BGA (Ball Grid Array) which has been practiced significantly widely in recent days.

When operating an electronic device, a heat is generated inside the electronic device due to a current applied for operation. The aforementioned solder ball is used to connect materials with different thermal expansion coefficients, such as a silicon chip, a resin substrate or the like. Accordingly, the solder ball is subjected to a thermal fatigue environment upon the operation of the electronic device. As a result, cracks may progress inside the solder ball, thus posing a problem of interfering with a receiving/sending of an electrical signal through the solder ball. In addition, mobile electronic devices have been rapidly reduced in size and weight in recent years. That is, with regard to a printed board or an integrated circuit substrate used in an electronic device in such case, a bonded area of each solder-bonded section used in an electronic member is shrunk, thus making it more important than ever to improve a thermal fatigue property. With regard to a solder ball formed into a conventional size, i.e., when the solder ball has a diameter of not smaller than 300 µm, an area of a bonded section composed of the solder ball and an electrode is sufficiently large. Accordingly, in such case, a decrease in a bonding strength between the solder ball and the electrode does not become a problem, and the thermal fatigue property is not adversely affected, even if an oxide layer on a surface of the solder ball fails to be completely removed during a reflow process and partially remains in a bonded interface. Here, in order to ensure the thermal fatigue property of the conventional Sn—Ag—Cu-based solder ball having the diameter of not smaller than 300 µm, it has been considered as effective to set an Ag concentration to about 3 to 4% by mass instead of ensuring the bonding strength of the bonded interface by removing the oxide layer on the solder ball surface. This is due to the following speculation. That is, an increased Ag concentration can allow an intermetallic compound called $Ag_3Sn$ to be precipitated in a large amount in the solder ball, thereby hardening the solder ball through a precipitation hardening effect, and thus making it difficult for the solder ball to be deformed by an external force. In this way, a displacement resulting from the thermal fatigue can be small even when a load occurs as a result of the corresponding thermal fatigue, thus making it possible to slow a crack progress inside the solder ball.

Further, it is required that the solder ball ensure: a wettability at the time of soldering; a low melting point such that the soldering can be performed at a temperature that is as low as possible; a surface quality such that a device on which the solder ball is mounted can correctly recognize the corresponding solder ball through image recognition at the time of mounting the same; and a drop resistance such that an electronic device exhibits no failure even after being inadvertently dropped.

PRIOR ART DOCUMENTS

Patent Document

Patent document 1: Japanese Unexamined Patent Application Publication No. 2003-1481
Patent document 2: Japanese Unexamined Patent Application Publication No. 2004-1100

DISCLOSURE OF THE INVENTION

Problems to be Solved by the Invention

With regard to the solder ball for use in an electronic member and mainly composed of Sn, Ag and Cu, the aforementioned thermal fatigue property can be ensured at a sufficient level when the diameter of the solder ball is, for example, not smaller than 300 µm as observed conventionally. However, the thermal fatigue cannot be ensured at a sufficient level if the diameter of the corresponding solder ball is not larger than 250 µm as observed in recent years, which has become a significantly serious problem. Here, the present invention provides a solder ball for semiconductor packaging and an electronic member having such solder ball. Specifically, there are provided: a solder ball for semiconductor packaging capable of ensuring a sufficient thermal fatigue property even when the diameter thereof is not larger than 250 µm; and an electronic member using such solder ball.

Means to Solve the Problems

Means to solve the aforementioned problem are as follows.
A solder ball for semiconductor packaging as set forth in a first aspect, is made of a solder alloy containing: Sn as a main element; 0.1-2.5% Ag by mass; 0.1-1.5% Cu by mass; and at least one of Mg, Al and Zn in a total amount of 0.0001-

0.005% by mass. This solder ball includes a surface having a noncrystalline phase of a thickness of 1-50 nm, such noncrystalline phase containing: at least one of Mg, Al and Zn; O; and Sn.

Here, a "main element" refers to an element occupying not less than 90% of the total by mass.

A solder ball for semiconductor packaging as set forth in a second aspect, is made of a solder alloy containing: Sn as a main element; 0.1-1.9% Ag by mass; 0.1-1.0% Cu by mass; and at least one of Mg, Al and Zn in a total amount of 0.0001-0.005% by mass. This solder ball includes a surface having a noncrystalline phase of a thickness of 1-50 nm, such noncrystalline phase containing: at least one of Mg, Al and Zn; O; and Sn.

According to a solder ball for semiconductor packaging as set forth in a third aspect, the solder alloy as set forth in the first or second aspect contains Ag in a concentration of 0.5-1.9% by mass.

According to a solder ball for semiconductor packaging as set forth in a fourth aspect, the solder alloy as set forth in any one of the first aspect through the third aspect further contains 0.01-5% by mass of Bi.

According to a solder ball for semiconductor packaging as set forth in a fifth aspect, the solder alloy as set forth in any one of the first aspect through the fourth aspect further contains at least one of Ni, P, Sb, Ce, La, Co, Fe and In in a total amount of 0.0005 to 0.5% by mass.

An electronic member as set forth in a sixth aspect includes: solder-bonded sections, in which at least one of the solder-bonded sections is formed using the solder ball for semiconductor packaging as set forth in any one of the first aspect through the fifth aspect.

Effects of the Present Invention

As described above, by using the solder ball for semiconductor packaging and the electronic member of the present invention, there can be ensured a sufficient thermal fatigue property even if the bonded section is formed using the solder ball having the diameter of not larger than 250 µm.

BRIEF DESCRIPTION OF THE DRAWINGS

FIG. 1 is an exemplary cross-sectional view of a solder ball of the present disclosure.

MODE FOR CARRYING OUT THE INVENTION

As a result of earnest studies conducted by the inventors, it became clear that even when there was applied to a solder ball with a diameter of not larger than 250 µm a conventional idea that a crack progressing therein could be slowed by increasing an Ag concentration, there cannot be ensured a sufficient thermal fatigue property because of an excessive growth of an oxide layer formed on a solder ball surface, and this phenomenon is noticeable when using a solder ball stored for several months after shipping. That is, (1) surface areas of solder balls per unit volume inevitably increase under the condition of the diameter of not larger than 250 µm, thereby causing the solder ball surface to be oxidized with time and the oxide layer on the solder ball surface to be formed so thick that it cannot be completely removed with a flux used in a reflow process. As a result, an oxide thereon remaining even after performing a reflow is likely to remain in a bonded interface between the solder ball and an electrode. (2) Further, an area in which the electrode and the solder ball are bonded to one another is inevitably small under the condition of the diameter of not larger than 250 µm, thereby causing even a small amount of the remaining oxide to occupy a substantial percentage of a bonded area, thus resulting in a low bonding strength between the solder ball and the electrode at the diameter of not larger than 250 µm even at a small number of fatigue cycles. As a result, the thermal fatigue property is deteriorated.

Here, as a result of the earnest studies conducted by the inventors, it was found out that the excessive growth of the oxide layer could be controlled by forming on the solder ball surface a noncrystalline phase having a thickness of 1 to 50 nm and containing: at least one of Mg, Al and Zn; O; and Sn. This allows a thickness of the oxide layer on the solder ball to substantially remain as thin as that at the time of shipping, even after storing the solder ball shipped for several months before using the same (specifically, the solder ball surface is referred to as a region to a depth of 80 nm from a surface of the solder ball). Further, the oxide layer can be removed without any difficulty with the flux used in the reflow process. The aforementioned effect is brought about by the following facts. That is, when the oxide layer is only composed of a crystalline tin oxide, the crystalline tin oxide grows with time by reacting with oxygen in the atmosphere, thus increasing a thickness of the oxide layer. In contrast, the aforementioned noncrystalline phase hardly reacts with oxygen in the atmosphere with time, thus causing the thickness of the oxide layer to hardly increase. It is speculated that while the crystalline tin oxide has a crystal grain boundary therein and the oxygen in the atmosphere can diffuse even into the crystalline tin oxide along the crystal grain boundary therein, the aforementioned noncrystalline phase has no crystal grain boundary therein, thus making it difficult for oxygen in the atmosphere to diffuse thereinto. In order to achieve the aforementioned effect, the noncrystalline phase needs to be formed to the thickness of 1 to 50 nm. However, it is difficult for the aforementioned effect to be achieved, if the noncrystalline phase is formed to a thickness of less than 1 nm. Meanwhile, although the aforementioned effect can be similarly achieved even with a noncrystalline phase thicker than 50 nm, the solder ball surface in such case has to be rapidly cooled at a substantial cooling rate as far as a later-described manufacturing method is concerned, thus unfavorably making it industrially difficult to uniformly control the thickness of the oxide layer to a given thickness. More preferably, the noncrystalline phase is formed to a thickness of not lamer than 30 nm so that the thickness of the oxide layer can be controlled more precisely. While the noncrystalline phase does not necessarily have to cover the solder ball surface on its own and can actually coexist with the crystalline tin oxide and a microcrystalline tin oxide, the noncrystalline phase needs to occupy the entire oxide layer by a percentage of not less than 30%.

However, when the noncrystalline phase occupies less than 30% of an entire thickness of the oxide layer, the crystalline tin oxide and the microcrystalline tin oxide grow thick with time, thus making it difficult to achieve the effect of controlling the growth of the oxide layer. Further, when the oxide layer of the noncrystalline phase is composed of only Sn and O without containing at least one of Mg, Al and Zn, the oxide layer, regardless of having the noncrystalline phase, is thickened slightly with time, thus making it impossible to achieve the effect of controlling the growth of the oxide layer.

In order to achieve such noncrystalline phase containing: at least one of Mg, Al and Zn; O; and Sn, there can be further added to a solder alloy at least one of Mg, Al and Zn in a total amount of 0.0001 to 0.005% by mass. It is speculated that since Mg, Al and Zn are metals less noble than Sn, they are preferentially oxidized ahead of Sn, thus forming a noncrystalline oxide layer when cooled rapidly. Meanwhile, the effect of forming the noncrystalline oxide layer cannot be achieved, if the total amount of at least one of Mg, Al and Zn is less than 0.0001% by mass. In contrast, when the corresponding total amount is greater than 0.005% by mass, Mg, Al or Zn is intensively oxidized, thus unfavorably causing the solder ball to be formed into a multangular shape other than a spherical shape. Here, just because Mg, Al or Zn is added does not mean that there can always be obtained "the noncrystalline phase containing at least one of Mg, Al and Zn; O; and Sn." In fact, there may be formed crystalline and microcrystalline oxides depending on an additive concentration. In order to precisely obtain the noncrystalline phase, the additive concentration of Mg, Al or Zn can be controlled according to an oxygen concentration in Sn serving as a raw material. Particularly, it is most effective to set the corresponding additive concentration to be about 0.3 to 1.0 times larger than the oxygen concentration in Sn serving as a raw material. For example, if the additive concentration is so small that it is less than 0.3 times the oxygen concentration in the solder ball, there can be formed crystalline or microcrystalline of SnO or $SnO_2$ without containing Mg, Al or Zn. In contrast, if the additive concentration is so excessive that it is greater than 1.0 times the oxygen concentration in the solder ball, there can be formed, for example, crystalline or microcrystalline of MaO, $Al_2O_3$ or ZnO. It is preferred that Mg be mainly added when adding the aforementioned elements. This is because Mg is less likely to deform the solder ball into a multangular shape, and no specific deformation is observed even when it is added in the amount of 0.005% by mass which is the upper limit. In contrast, Al and Zn are more likely to be oxidized than Mg. That is, if Al and/or Zn are added in the amount of 0.005% by mass which is the upper limit, even a surface of a solder ball manufactured through the later-described manufacturing method, slightly exhibits the type of deformation of turning the ball into a multangular shape when exposed somehow to an environment in which oxidation takes place easily. While a trace of such oxidation on the solder ball surface can be observed through a high-resolution electron microscope such as a field emission-scanning electron microscope (FE-SEM) or the like, such trace of oxidation cannot be easily observed through an SEM employing a normal LaB6 or tungsten as a filament due to the fact that a focus of an electron gun thereof cannot be narrowed.

In terms of generously proven methods performed with high precisions, it is preferred that the noncrystalline phase is identified through a diffraction pattern of a transmission electron microscope (TEM) and an energy dispersive X-ray spectrometry (EDX) installed in the TEM, and that the thickness of the corresponding noncrystalline phase is measured through the TEM or an auger electron spectroscopy (AES).

As a result of further studies conducted by the inventors, it became clear that there was another cause for the aforementioned problem that "even when there was applied to a solder ball with a diameter of not larger than 250 μm a conventional idea that a crack progress therein could be slowed by increasing an Ag concentration, there cannot be ensured a sufficient thermal fatigue property." Specifically, a relational expression "thermal strain≈displacement÷ball size" is true in general. However, while the displacement is determined by a difference in coefficient of thermal expansion between materials composing a device and therefore is substantially constant, the thermal strain increases as the size of the solder ball decreases. For this reason, the solder ball with the diameter of not larger than 250 μm exhibits a thermal strain larger than that exhibited by a solder ball with a diameter of not smaller than 300 μm.

(1) Solder Ball With Diameter of Not Smaller Than 300 μm:
A breakage occurs inside the solder ball since the thermal strain does not exceed a deformability of the solder ball.
(2) Solder Ball With Diameter of Not Larger Than 250 μm:
As for a hard ball, a breakage occurs in a bonded-interface since the thermal strain exceeds the deformability of the solder ball. As for a soft ball, the breakage occurs inside the solder ball since the thermal strain does not exceed the deformability of the solder ball. That is, in the case of (1), the thermal strain is within a range of the deformability of the solder regardless of the solder ball being either hard or soft, thereby making it even more difficult for the hard solder ball to be deformed. As a result, the displacement itself decreases, thereby slowing the crack progress taking place inside the solder ball, thus resulting in a more favorable thermal fatigue property. In contrast, in the case of (2) in which the solder ball has the diameter of not larger than 250 μm, the thermal strain exceeds the range of the deformability of the solder when there is employed the hard solder ball. For this reason, the solder ball cannot be sufficiently deformed with respect to such thermal strain, thereby causing the bonded interface to bear a shortfall in deformation, thus causing cracks to progress not inside the solder ball but in the bonded interface. At that time, since a brittle intermetallic compound has grown thick in the bonded interface, the crack progress in the bonded interface takes place rapidly (e.g., as if a glass is being broken), thus resulting in a poor thermal fatigue property.
(3) As a result of the earnest studies conducted by the inventors, the following facts were found out. Particularly, the inventors found out that there had to be employed an idea different from the conventional one, when the solder ball had the diameter of not larger than 250 μm and exhibited a large thermal strain accordingly. That is, the solder ball is softened when the Ag concentration in the solder alloy is set to be not higher than 2.5% by mass. The softened solder ball allows the thermal strain increasing exponentially due to a smaller diameter of the solder ball to be absorbed as the solder ball itself undergoes deformation, and prevents a shear stress from even affecting the bonded interface. In this way, there can be ensured a breakage mode in which the crack progress takes place inside the solder ball as is the case with the solder ball having the diameter of not smaller than 300 μm. When the thermal strain exceeds the range of the solder deformability, the crack progress takes place in the bonded interface, thus resulting in a poor thermal fatigue property. However, as long as the thermal strain does not exceed the range of the solder deformability, even the hard solder ball can be put in a state in which the deformation does not take place easily, thereby slowing the crack progress inside the solder ball, thus resulting in a more favorable thermal fatigue property. That is, under the condition in which a large thermal strain is found in the solder ball with the diameter of not larger than 250 μm, the thermal fatigue property can be improved by increasing the Ag concentration in the solder such that the thermal strain does not exceed the range of the solder deformability, and hardening the solder accordingly.

Meanwhile, if the Ag concentration is higher than 2.5% by mass, the solder hardens excessively, thereby causing the crack progress observed in a thermal fatigue test to take place in the aforementioned brittle intermetallic compound, thus extremely shortening a thermal fatigue life. When the Ag concentration is less than 0.1% by mass, a melting point of the solder ball increases to about 232° C. which is a melting point of Sn, thereby making it inevitable to set a reflow temperature, which is one of the requirements for manufacture, high, thus industrially unfavorably incurring an increase in a production cost. That is, an appropriate Ag concentration is 0.1 to 2.5% by mass when the diameter of the solder ball is not larger than 250 μm. With regard to the case in which the diameter of the solder ball is not larger than 250 μm, it is industrially preferred that the Ag concentration is set to be 0.5 to 2.5% by mass so that a low reflow temperature can be employed, and more preferred that the Ag concentration is set to be 0.9 to 2.2% by mass so that there can be advantageously achieved both a favorable thermal fatigue property and an operation at a low reflow temperature, in a balanced manner.

Further, in order to ensure a wettability of the solder ball, a Cu concentration can be set to be 0.1 to 1.5% by mass. However, such a kind of effect cannot be achieved when the Cu concentration is less than 0.1% by mass. In contrast, the solder ball is easily oxidized when the Cu concentration is higher than 1.5% by mass, which is why an upper limit for the Cu concentration is set to be 1.5% by mass. Here, it is preferred that the Cu concentration is set to be 0.1 to 1.2% by mass so that a problem of oxidation can be avoided even when there is employed as a raw material an Sn containing oxygen at a high oxygen concentration of not lower than 30 ppm. Further, it is more preferred that the Cu concentration is set to be 0.1 to 1.0% by mass so that the aforementioned effect can be further improved. That is, in order to solve the aforementioned problem with respect to the solder ball having the diameter of not larger than 250.mu.m, there can be used a solder ball for semiconductor packaging that is made of a solder alloy containing: Sn as a main element; 0.1-2.5% Ag by mass; 0.1-1.5% Cu by mass; and at least one of Mg, Al and Zn in a total amount of 0.0001-0.005% by mass. Further, as shown in FIG. 1, a surface of such solder ball has a noncrystalline phase of a thickness of 1-50 nm, such noncrystalline phase containing: at least one of Mg, Al and Zn; O; and Sn.

Further, with regard to a case in which the diameter of the solder ball is not larger than 180 μm, while the size of the ball is now smaller, the displacement applied to the solder at the time of the thermal fatigue test remains substantially identical to those of the balls having the diameters of 250 μm and 300 μm, thus causing the thermal strain (≈displacement÷ball size) to further increase. For this reason, the solder is now subjected to a rougher impact even under an identical condition for the thermal fatigue test, thereby lowering, at the time of the thermal fatigue test, an upper limit of the Ag concentration at which the crack progress starts to take place in the brittle intermetallic compound. As a result of the earnest studies conducted by the inventors, it was found out that the upper limit of the Ag concentration was preferably set to be 1.9% by mass when the diameter of the solder ball was not smaller than 100 μm and not larger than 180 μm. That is, when the Ag concentration in the solder alloy is higher than 1.9% by mass, an excessively high hardness is resulted, thus making it impossible for the solder to absorb the shear stress resulting from the thermal fatigue through the deformation of the solder ball itself. For this reason, there is resulted a breakage mode in which the crack progress takes place not inside the solder ball, but in the brittle phase of the bonded interface, thus causing the thermal fatigue property to be easily deteriorated.

That is, an appropriate Ag concentration is 0.1 to 1.9% by mass when the diameter of the solder ball is not smaller than 100 μm and not larger than 180 μm. Further, with regard to the case in which the diameter is not larger than 180 μm, it is industrially preferred that the Ag concentration is set to be 0.5 to 1.9% by mass so that a low reflow temperature can be employed, and more preferred that the Ag concentration is set to be 0.5 to 1.0% by mass so that there can be advantageously achieved both a softening of the solder alloy and the operation at a low reflow temperature, in a balanced manner.

As a result of the earnest studies conducted by the inventors, it was found out that the thermal fatigue property could be further improved significantly by allowing the solder ball of the present invention to further contain 0.01 to 5% by mass of Bi. Such effect cannot be achieved when Bi is added in a percentage of less than 0.01% by mass. In contrast, it is not preferred that Bi is added in a percentage of greater than 5% by mass, because Bi added in such percentage is easily oxidized and thus causes the solder ball surface to be formed into a concavo-convex shape. More preferably, the effect of improving the thermal fatigue property is reinforced when Bi is added in a percentage of 1 to 5% by mass. Most preferably, the effect of improving the thermal fatigue property is significantly reinforced when Bi is added in a percentage of 2 to 5% by mass.

However, this phenomenon is unique to the solder ball containing at least one of Mg, Al and Zn in a total amount of 0.0001-0.005% by mass. In fact, the thermal fatigue property cannot be significantly improved even if Bi is added to a solder ball not satisfying the aforementioned composition range, in the percentage of 0.01 to 5% by mass. This is due to an interaction between Bi and Mg, Al or Zn. That is, a noncrystalline layer is formed on a solder surface by adding Mg, Al or Zn at an appropriate concentration, thereby preventing Bi from being excessively oxidized, thus allowing a majority of Bi added to dissolve in Sn composing the solder and a mechanical property of the solder to be effectively strengthened (solid solution strengthening) accordingly. However, it is difficult for the noncrystalline layer to be formed on the solder surface if the concentration of Mg, Al or Zn is below the aforementioned range. In such case, the majority of Bi added is easily oxidized, thus making it difficult to anticipate solid solution strengthening. Further, it is not preferred that the concentration of Mg, Al or Zn be higher than 0.005% by mass. Because, in such case, Mg, Al or Zn is intensively oxidized as described above so as to cause the solder ball to be formed not into a spherical shape but into a multangular shape, thereby making it impossible to form a solder bump of an appropriate shape even at the time of packaging, thus resulting in a poor thermal fatigue property.

As described above, it is also required that a drop resistance of the solder ball be ensured so that no failure occurs in an electronic device that has been inadvertently dropped. The drop resistance is often evaluated by first placing a specimen on specimen mounting stage, and then repeatedly dropping such specimen from a height of 30 to 100 cm so as to confirm a change in an electric resistance of each solder-bonded section every time the specimen is dropped. The drop resistance is ensured by allowing the solder ball to further contain at least one of Ni, P, Sb, Ce, La, Co, Fe and In in a total amount of 0.0005 to 0.5% by mass. By allowing the solder ball to contain the aforementioned elements, there can be inhibited a diffusion between Sn and an element composing the electrode, thus achieving an effect of thinning an intermetallic compound phase in the bonded interface. A thin intermetallic compound phase allows a crack occurrence and the crack progress to be controlled even when an impact has been transmitted to the bonded interface as a result of inadvertently dropping the electronic device. However, such effect cannot be sufficiently achieved when an amount of the elements contained is less than 0.0005% by mass. In contrast, it is industrially not preferred that the amount of the elements contained is greater than 0.5% by mass, because a melting point of the solder ball in such case increases exponentially.

While there is no limitation on a method for identifying a composition of the solder ball, it is preferred that there is employed a generously proven method performed with a high precision, such method involving, for example, the EDX, an electron probe micro analyzer (EPMA), the AES, a secondary ion-microprobe mass spectrometer (SIMS), an inductively coupled plasma (ICP), a glow discharge mass spectrometry (GD-MASS) or an X-ray fluorescence spectrometer).

As for a manufacturing method of the aforementioned solder ball, a solder mother alloy prepared by adding thereto elements in the given concentrations, is heated and melted in a crucible or a mold so as to be homogenized, followed by solidifying the alloy thus homogenized. However, depending on an atmosphere in which the solder mother alloy is melted, there may occur a failure in which the elements added are oxidized and thus cannot be contained in the solder. Here, as for the process of melting the solder mother alloy, an atmosphere around the solder can be, for example, an atmosphere having an oxygen partial pressure of 0.1 to 100 Pa or an non-oxidation atmosphere having a low pressure of 0.1 to 101300 Pa, so that the oxidations of the added elements in the solder ball can be controlled, and the added elements can thus be reliably contained in the solder alloy. As a non-oxidation atmosphere, there can be employed, for example, an inert gas such as nitrogen, argon, neon or the like, or a reductive gas such as CO, hydrogen or the like. The reason for that is because oxygen in the solder alloy can be daerated by using such atmosphere. However, when a pressure in a specific oxygen partial pressure atmosphere or in the non-oxidation atmosphere is below 0.1 Pa, the elements added in minute amounts in the solder are vaporized and then removed from the corresponding solder, thus causing the concentrations of the added elements in the solder ball to vary. In contrast, when the oxygen partial pressure is greater than 100 Pa, a substantial amount of oxygen is caused to remain in the atmosphere, thus making it impossible to achieve the aforementioned effect. Further, since the pressure of 101300 Pa is an average atmospheric pressure, a pressure in the non-oxidation atmosphere that is greater than 101300 Pa increases a risk of leaking the non-oxidation atmosphere to the outside of the crucible. As for the process of melting the solder mother alloy, there can be preferably used a mold capable of shielding an interior section from an outside air by sealing because the use of the mold is generously proven.

Further, in order to form on the solder ball surface a non-crystalline phase mainly composed of O and Sn, it is crucial to increase as much as possible the cooling rate at which the melted solder alloy is solidified so as to form the solder ball, in the process of manufacturing the corresponding solder ball. Particularly, it is preferred that the cooling rate is not lower than 100° C./s, and more preferred that the cooling rate is not lower than 300° C./s so that the aforementioned noncrystalline phase can be stably formed thick. Such cooling rate can be achieved simply by spraying a cold gas on a solidifying solder alloy in a cooling process. Further, such cooling rate can also be achieved by, for example, performing a water cooling in which the solidifying solder alloy is dropped into water. However, it is industrially not preferred that the cooling rate is higher than 800° C. The reason for that is because although a noncrystalline phase of a thickness of greater than 50 nm can be formed at such rate, a large amount of cold gas is required in such case, thus leading to a high cost.

While there is no specific requirement for the shape of the solder ball of the present invention, it is generously proven and thus industrially preferred that the solder ball forms a protruding section as a result of imprinting a ball-shaped solder alloy on a bonding section, or such protruding section can further-be mounted on another electrode, for example.

Other than the BGA type semiconductor device, the solder ball of the present invention is also effective when used as a connection terminal of a CSP (Chip Scale Package) type semiconductor device or a FC (Flip Chip) type semiconductor device. When using the solder ball of the present working example as a connection terminal of the aforementioned semiconductor device, an organic material such as a flux or a solder paste is at first applied on electrodes on a printed circuit board, followed by arranging the solder balls thereon and then forming solid solder-bonded sections through the aforementioned reflow process, thus obtaining an electronic member.

The electronic member of the present embodiment refers to an electronic member of the BGA, CSP or FC type in which the solder ball of the present embodiment is mounted, or an electronic member obtained by applying the flux or solder paste on the electrodes on the printed circuit board before mounting an electronic component thereon, and then performing a solid soldering through the aforementioned reflow process so as to allow the electronic component to be further mounted on the printed board. Further, instead of using the printed board, there can also be used a flexible wiring tape such as a TAB (Tape Automated Bonding) tape, and a metallic wiring such as a lead frame.

There has been described so far the preferred embodiment of the present invention. However, the present invention is also capable of solving the following problems that have become noticeable recently, through appropriate modifications. The first problem relates to a multi-time reflow. Specifically, a strength of the solder is more contributed to by a granular alloy phase precipitated in the solder than Sn serving as a parent phase. That is, the strength of the solder increases when there exist a large number of fine granular alloy phases. However, such granular alloy phases are susceptible to heat. For example, performing the multi-time reflow causes such granular alloy phases to be repeatedly subjected to a high temperature environment whose temperature exceeds a melting temperature, thus coarsening the corresponding granular alloy phases and reducing a number thereof. This has never been a problem with the solder ball having the diameter of about 300 μm. However, with regard to the solder ball having the diameter of not larger than 250 μm, performing the multi-time reflow makes it impossible for the solder to ensure a required strength for the aforementioned reason, thus causing the solder to undergo an excessive deformation when a stress is applied thereto and resulting in a short circuit or wire breakage in the worst case.

According to the present invention, the aforementioned problem can be solved by adding both Mg and Ni. This is because, by adding both Mg and Ni, coarse $Cu_6Sn_5$ in the solder can be refined even when there is performed the multi-time reflow. That is, although performing the multi-time reflow causes $Ag_3Sn$ to be coarsened and a total number of the fine granular alloy phases in the solder to be reduced, the aforementioned refined $Cu_6Sn_5$ can serve to compensate such reduction, thereby achieving a precipitation hardening effect, and thus preventing a decrease in the strength of the solder ball. Although a detailed cause for this remains unidentified, it is speculated that when Cu in the coarse $Cu_6Sn_5$ is displaced by Ni to form fine $(Cu, Ni)_6Sn_5$, Mg serves as a catalyst and actually facilitates the aforementioned displacement. However, such effect cannot be sufficiently observed when there is only added Ni without adding Mg also.

The second problem relates to an electrode peeling. Recently, a structure of the electrode has started to shift from that of a Cu electrode or Cu/Ni/Au electrode to that of a Cu/Ni/Pd/Au electrode. Even when there is used such a kind of electrode, one to two cycles of the reflow do not cause a diffusion between the solder and the electrode to progress significantly, thereby preventing a brittle alloy phase in a solder/electrode interface from growing into a layer. However, in such case, performing the multi-time reflow makes an impact of the aforementioned diffusion unignorable. That is, the alloy phase in the solder/electrode interface grows into a layer so as to cause the electrode peeling and incur the short circuit or wire breakage in the worst case. This trend is frequently observed when there is used the Cu/Ni/Pd/Au electrode especially.

In order to control the aforementioned electrode peeling, the brittle alloy phase in the solder/electrode interface needs to be restrained from growing into a layer. Particularly, according to the present invention, by adding both Mg and Ni, an interdiffusion in the solder/electrode interface can be slowed, thereby favorably causing the brittle alloy phase to be formed thin and into a smooth shape. Here, although such a kind of effect can also be observed when there is added only Ni, the effect observed under such condition is not necessarily sufficient. That is, it is preferred that both Mg and Ni are added as described above in order to reliably thin the brittle alloy phase. It is speculated that this is because while Ni serves to slow the interdiffusion in the solder/electrode interface by acting as a barrier against the interdiffusion, Mg serves as a catalyst facilitating Ni's role as a diffusion barrier such that Ni can further reliably act as a diffusion barrier.

WORKING EXAMPLES

A raw material prepared by adding to a main element additional elements of the present working examples, was placed in a black lead crucible, followed by heating and melting the raw material placed in the black lead crucible through a high-frequency melting furnace. The raw material thus heated and melted was then cooled so as to obtain a solder alloy. Here, an oxygen concentration in Sn serving as the raw material was measured through a combustion method, and the concentration thus measured is shown in Table 1 and Table 2. A heating temperature was set to be 300° C. Next, the solder alloy was formed into a wire rod having a wire diameter of 20 μm. Such wire rod was then cut at lengths of 26.1 mm and 9.72 mm so as to obtain a given volume thereof before being heated and melted again through the high-frequency melting furnace. Solder balls having diameters of 250 μm and 180 μm were then obtained respectively by cooling the wire rod thus heated and melted. A reheating temperature was set to be 350° C. Here, an atmosphere inside the high-frequency melting furnace was nitrogen, and an oxygen partial pressure therein was set to be about 100 Pa. Further, when manufacturing the solder balls, a cold gas was sprayed on a solder during a cooling process, and a cooling rate was set to be as large as 300° C./s. A composition of each solder ball was identified through an ICP analysis, and a value thus identified is shown in Table 1 through Table 5. A melting point of each solder ball was measured using a differential scanning calorimeter (DSC), and a value thus measured is shown in Table 1 through Table 5. A noncrystalline phase was identified through a TEM and an EDX, and elements identified in the noncrystalline phase are shown in Table 1 and Table 2. Further, thicknesses of the noncrystalline phase and a total tin oxide were measured through the TEM, and an occupancy of a noncrystalline tin oxide in the total tin oxide was further calculated. A value thus calculated is shown in Table 1 and Table 2. Furthermore, a level of oxidization on the surface of a solder ball was observed, using an FE-SEM and the EDX at 50,000-fold magnification. Here, in Table 1 and Table 2, crosses were given to solder balls whose surfaces had deformed into a multangular shape, triangles were given to solder balls slightly exhibiting the aforementioned type of deformation, and circles were given to solder balls not exhibiting the aforementioned type of deformation at all.

As a printed board for mounting the solder balls, there was used a printed board having a size of 40 mm×30 mm×1 mm, an electrode pitch of 0.3 mm and a Cu electrode with a surface thereof being Cu as it is. The solder balls were mounted on such printed board after applying an aqueous flux on the corresponding printed board, followed by heating and then cooling the printed board on which the solder balls were mounted in a reflow furnace whose peak temperature was maintained at 250° C., thus forming solder bumps on the printed board. Further, a similar method was used to bond a semiconductor device on the solder bumps, thus obtaining an electronic component composed of the printed board, the solder bumps and the semiconductor device, successively. Particularly, the semiconductor device was 8 mm square, and had 324 pins along with a Cu electrode.

Further, as a standard for several specimens described above, an electronic component composed of the printed board and the solder bumps over the printed board was further heated and cooled in the reflow furnace for four cycles after being obtained. The specimens used to perform such a kind of test are shown in Table 6. Further, a similar test was also performed with a Cu/Ni/Au electrode and a Cu/Ni/Pd/Au electrode, as far as the aforementioned test is concerned.

A thermal fatigue resistance was evaluated through a TCT test (Thermal Cycle Test). Here, an environmental temperature of the specimens was changed for multiple cycles in a range of −40° C. to +125° C. The specimens were removed from a TCT testing device once every 25 cycles of the temperature change. It was considered that failures had occurred, if an electric resistance value was found to have more than doubled an initial value through a conductivity test, at every time when they were removed. A number of cycles it took for the failures to first occur was considered as a TCT life shown in Table 1 and Table 2. With regard to a thermal fatigue resistance when the diameters of the solder balls were 250 μm, it was considered as favorable if it had taken not less than 500 cycles for the failures to first occur. With regard to a thermal fatigue resistance when the diameters of the solder balls were 180 μm, it was considered as favorable if it had taken not less than 300 cycles for the failures to first occur.

A drop resistance was evaluated through a test method compliant with JESD22-B111 which is a standard of JEDEC (Solid State Technology Association). Here, conductivities of the specimens were confirmed per drop. It was considered that the failures had occurred if the conductivities had more than doubled initial values. A number of cycles it took for the failures to first occur was considered as a drop impact resistance life shown in Table 4 and Table 5.

A pull strength measurement was carried out only with respect to the specimens that had gone through the type of multi-time reflow test described above. Here, a commercially available pull strength measurement device (Dage 2400PC) was used to carry out a pull test in which a test rate was 300 μm/s, and a closing pressure of a specimen holder was 10 PSi. A pull strength value was calculated by averaging maximum pull strengths of 50 spots that were obtained before a holding time (2 seconds) had passed during the measurement. The pull strength value is shown in Table 6. With regard to a pull strength obtained after performing the multi-time reflow test at the diameter of 250 μm, a value of not less than 4000 mN was considered as acceptable. Further, a peel interface formed after performing the pull test was observed in 50 spots, using an optical microscope. Here, as shown in a column titled "peel surface" in Table 6, crosses represent a condition in which an electrode material and a material thereunder were observed in not less than five spots. Further, triangles represent a condition that is problem-free in terms of practical use, in which the electrode material and the material thereunder were observed in not more than four spots. Furthermore, circles represent a condition in which the electrode material and the material thereunder were not observed at all.

Thermal Fatigue Property at Diameter of 250 μm

TABLE 1

| | Composition (% by mass) | | | | | | Oxygen concentration in Sn as raw material | Element in noncrystalline |
|---|---|---|---|---|---|---|---|---|
| | Sn | Ag | Cu | Mg | Al | Zn | (% by mass) | phase |
| Working example 1 | Remainder | 0.1 | 0.1 | 0.0001 | 0 | 0 | 0.0003 | Sn, O, Mg |
| Working example 2 | Remainder | 0.3 | 0.5 | 0 | 0.0001 | 0 | 0.0001 | Sn, O, Al |
| Working example 3 | Remainder | 0.5 | 1.0 | 0 | 0 | 0.0001 | 0.0001 | Sn, O, Zn |
| Working example 4 | Remainder | 0.7 | 1.2 | 0.0010 | 0 | 0 | 0.0033 | Sn, O, Mg |
| Working example 5 | Remainder | 0.9 | 1.5 | 0.0001 | 0 | 0 | 0.0003 | Sn, O, Mg |
| Working example 6 | Remainder | 0.9 | 1.5 | 0.0010 | 0 | 0 | 0.0033 | Sn, O, Mg |
| Working example 7 | Remainder | 0.9 | 1.5 | 0.0050 | 0 | 0 | 0.0167 | Sn, O, Mg |
| Working example 8 | Remainder | 0.9 | 1.5 | 0 | 0.0001 | 0 | 0.0001 | Sn, O, Al |
| Working example 9 | Remainder | 0.9 | 1.5 | 0 | 0.0010 | 0 | 0.0010 | Sn, O, Al |
| Working example 10 | Remainder | 0.9 | 1.5 | 0 | 0.0050 | 0 | 0.0050 | Sn, O, Al |
| Working example 11 | Remainder | 0.9 | 1.5 | 0 | 0 | 0.0001 | 0.0001 | Sn, O, Zn |
| Working example 12 | Remainder | 0.9 | 1.5 | 0 | 0 | 0.0010 | 0.0010 | Sn, O, Zn |
| Working example 13 | Remainder | 0.9 | 1.5 | 0 | 0 | 0.0050 | 0.0050 | Sn, O, Zn |
| Working example 14 | Remainder | 0.9 | 1.5 | 0.0001 | 0.0001 | 0 | 0.0004 | Sn, O, Mg, Al |
| Working example 15 | Remainder | 0.9 | 1.5 | 0.0001 | 0 | 0.0001 | 0.0004 | Sn, O, Mg, Zn |
| Working example 16 | Remainder | 0.9 | 1.5 | 0.0001 | 0.0001 | 0.0001 | 0.0007 | Sn, O, Mg, Al, Zn |
| Working example 17 | Remainder | 1.2 | 1.5 | 0.0001 | 0 | 0 | 0.0003 | Sn, O, Mg |
| Working example 18 | Remainder | 1.2 | 1.5 | 0.0010 | 0 | 0 | 0.0033 | Sn, O, Mg |
| Working example 19 | Remainder | 1.2 | 1.5 | 0.0050 | 0 | 0 | 0.0167 | Sn, O, Mg |
| Working example 20 | Remainder | 1.2 | 1.5 | 0 | 0.0001 | 0 | 0.0001 | Sn, O, Al |
| Working example 21 | Remainder | 1.2 | 1.5 | 0 | 0.0010 | 0 | 0.0010 | Sn, O, Al |
| Working example 22 | Remainder | 1.2 | 1.5 | 0 | 0.0050 | 0 | 0.0050 | Sn, O, Al |
| Working example 23 | Remainder | 1.2 | 1.5 | 0 | 0 | 0.0001 | 0.0001 | Sn, O, Zn |
| Working example 24 | Remainder | 1.2 | 1.5 | 0 | 0 | 0.0010 | 0.0010 | Sn, O, Zn |
| Working example 25 | Remainder | 1.2 | 1.5 | 0 | 0 | 0.0050 | 0.0050 | Sn, O, Zn |
| Working example 26 | Remainder | 1.2 | 1.5 | 0.0001 | 0.0001 | | 0.0004 | Sn, O, Mg, Al |
| Working example 27 | Remainder | 1.2 | 1.5 | 0.0001 | 0 | 0.0001 | 0.0004 | Sn, O, Mg, Zn |
| Working example 28 | Remainder | 1.2 | 1.5 | 0.0001 | 0.0001 | 0.0001 | 0.0007 | Sn, O, Mg, Al, Zn |
| Working example 29 | Remainder | 1.8 | 1.2 | 0.0001 | 0 | 0 | 0.0003 | Sn, O, Mg |
| Working example 30 | Remainder | 2.0 | 1.2 | 0.0010 | 0 | 0 | 0.0033 | Sn, O, Mg |
| Working example 31 | Remainder | 2.2 | 1.5 | 0.0001 | 0 | 0 | 0.0003 | Sn, O, Mg |
| Working example 32 | Remainder | 2.2 | 1.5 | 0.0010 | 0 | 0 | 0.0033 | Sn, O, Mg |
| Working example 33 | Remainder | 2.2 | 1.5 | 0.0050 | 0 | 0 | 0.0167 | Sn, O, Mg |
| Working example 34 | Remainder | 2.2 | 1.5 | 0 | 0.0001 | 0 | 0.0001 | Sn, O, Al |
| Working example 35 | Remainder | 2.2 | 1.5 | 0 | 0.0010 | 0 | 0.0010 | Sn, O, Al |
| Working example 36 | Remainder | 2.2 | 1.5 | 0 | 0.0050 | 0 | 0.0050 | Sn, O, Al |
| Working example 37 | Remainder | 2.2 | 1.5 | 0 | 0 | 0.0001 | 0.0001 | Sn, O, Zn |
| Working example 38 | Remainder | 2.2 | 1.5 | 0 | 0 | 0.0010 | 0.0010 | Sn, O, Zn |
| Working example 39 | Remainder | 2.2 | 1.5 | 0 | 0 | 0.0050 | 0.0050 | Sn, O, Zn |
| Working example 40 | Remainder | 2.2 | 1.5 | 0.0001 | 0.0001 | | 0.0004 | Sn, O, Mg, Al |
| Working example 41 | Remainder | 2.2 | 1.5 | 0.0001 | 0 | 0.0001 | 0.0004 | Sn, O, Mg, Zn |
| Working example 42 | Remainder | 2.2 | 1.5 | 0.0001 | 0.0001 | 0.0001 | 0.0007 | Sn, O, Mg, Al, Zn |
| Working example 43 | Remainder | 2.5 | 1.2 | 0.0010 | 0 | 0 | 0.0033 | Sn, O, Mg |
| Comparative example 1 | Remainder | 0 | 0.7 | 0 | 0 | 0 | 0.0001 | None |
| Comparative example 2 | Remainder | 3 | 0.5 | 0 | 0 | 0 | 0.0003 | None |
| Comparative example 3 | Remainder | 0.1 | 0.1 | 0 | 0 | 0 | 0.0010 | None |
| Comparative example 4 | Remainder | 1.2 | 0.5 | 0 | 0 | 0.0060 | 0.0050 | None |

| | Melting point (° C.) | Noncrystalline phase thickness (nm) | Occupancy of noncrystalline tin oxide (%) | TCT life (Cycle) | Oxidation on ball surface |
|---|---|---|---|---|---|
| Working example 1 | 227 | 1 | 30 | 575 | ○ |
| Working example 2 | 226 | 2 | 30 | 550 | ○ |
| Working example 3 | 225 | 3 | 30 | 550 | ○ |
| Working example 4 | 224 | 20 | 50 | 600 | ○ |
| Working example 5 | 223 | 1 | 30 | 600 | ○ |
| Working example 6 | 223 | 20 | 50 | 625 | ○ |
| Working example 7 | 223 | 40 | 60 | 600 | ○ |
| Working example 8 | 223 | 2 | 30 | 575 | ○ |
| Working example 9 | 223 | 25 | 50 | 600 | ○ |
| Working example 10 | 223 | 45 | 60 | 575 | Δ |
| Working example 11 | 223 | 3 | 30 | 575 | ○ |
| Working example 12 | 223 | 30 | 50 | 600 | ○ |
| Working example 13 | 223 | 50 | 60 | 575 | Δ |
| Working example 14 | 223 | 3 | 30 | 600 | ○ |

TABLE 1-continued

| | Col1 | Col2 | Col3 | Col4 | Col5 |
|---|---|---|---|---|---|
| Working example 15 | 223 | 4 | 30 | 600 | ○ |
| Working example 16 | 223 | 6 | 30 | 600 | ○ |
| Working example 17 | 223 | 1 | 30 | 650 | ○ |
| Working example 18 | 223 | 20 | 50 | 675 | ○ |
| Working example 19 | 223 | 40 | 60 | 650 | ○ |
| Working example 20 | 223 | 2 | 30 | 625 | ○ |
| Working example 21 | 223 | 25 | 50 | 650 | ○ |
| Working example 22 | 223 | 45 | 60 | 625 | Δ |
| Working example 23 | 223 | 3 | 30 | 625 | ○ |
| Working example 24 | 223 | 30 | 50 | 650 | ○ |
| Working example 25 | 223 | 50 | 60 | 625 | Δ |
| Working example 26 | 223 | 3 | 30 | 650 | ○ |
| Working example 27 | 223 | 4 | 30 | 650 | ○ |
| Working example 28 | 223 | 6 | 30 | 650 | ○ |
| Working example 29 | 221 | 1 | 30 | 675 | ○ |
| Working example 30 | 219 | 20 | 50 | 725 | ○ |
| Working example 31 | 219 | 1 | 30 | 725 | ○ |
| Working example 32 | 219 | 20 | 50 | 750 | ○ |
| Working example 33 | 219 | 40 | 60 | 725 | ○ |
| Working example 34 | 219 | 2 | 30 | 700 | ○ |
| Working example 35 | 219 | 25 | 50 | 725 | ○ |
| Working example 36 | 219 | 45 | 60 | 700 | Δ |
| Working example 37 | 219 | 3 | 30 | 700 | ○ |
| Working example 38 | 219 | 30 | 50 | 725 | ○ |
| Working example 39 | 219 | 50 | 60 | 700 | Δ |
| Working example 40 | 219 | 3 | 30 | 725 | ○ |
| Working example 41 | 219 | 4 | 30 | 725 | ○ |
| Working example 42 | 219 | 6 | 30 | 725 | ○ |
| Working example 43 | 219 | 20 | 50 | 575 | ○ |
| Comparative example 1 | 232 | 0 | 0 | 425 | ○ |
| Comparative example 2 | 218 | 0 | 0 | 450 | ○ |
| Comparative example 3 | 227 | 0 | 0 | 475 | ○ |
| Comparative example 4 | 221 | 60 | 20 | 450 | X |

Thermal Fatigue Property at Diameter of 180 μm

TABLE 2

| | Composition (% by mass) | | | | | Oxygen concentration in Sn as raw material (% by mass) | Element in noncrystalline phase |
|---|---|---|---|---|---|---|---|
| | Sn | Ag | Cu | Mg | Al | Zn | |
| Working example 44 | Remainder | 0.1 | 0.1 | 0.0001 | 0 | 0 | 0.0003 | Sn, O, Mg |
| Working example 45 | Remainder | 0.3 | 0.3 | 0 | 0.0001 | 0 | 0.0001 | Sn, O, Al |
| Working example 46 | Remainder | 0.5 | 0.5 | 0 | 0 | 0.0001 | 0.0001 | Sn, O, Zn |
| Working example 47 | Remainder | 0.7 | 0.7 | 0.0010 | 0 | 0 | 0.0033 | Sn, O, Mg |
| Working example 48 | Remainder | 0.9 | 1.0 | 0.0001 | 0 | 0 | 0.0003 | Sn, O, Mg |
| Working example 49 | Remainder | 0.9 | 1.0 | 0.0010 | 0 | 0 | 0.0033 | Sn, O, Mg |
| Working example 50 | Remainder | 0.9 | 1.0 | 0.0050 | 0 | 0 | 0.0167 | Sn, O, Mg |
| Working example 51 | Remainder | 0.9 | 1.0 | 0 | 0.0001 | 0 | 0.0001 | Sn, O, Al |
| Working example 52 | Remainder | 0.9 | 1.0 | 0 | 0.0010 | 0 | 0.0010 | Sn, O, Al |
| Working example 53 | Remainder | 0.9 | 1.0 | 0 | 0.0050 | 0 | 0.0050 | Sn, O, Al |
| Working example 54 | Remainder | 0.9 | 1.0 | 0 | 0 | 0.0001 | 0.0001 | Sn, O, Zn |
| Working example 55 | Remainder | 0.9 | 1.0 | 0 | 0 | 0.0010 | 0.0010 | Sn, O, Zn |
| Working example 56 | Remainder | 0.9 | 1.0 | 0 | 0 | 0.0050 | 0.0050 | Sn, O, Zn |
| Working example 57 | Remainder | 0.9 | 1.0 | 0.0001 | 0.0001 | 0 | 0.0004 | Sn, O, Mg, Al |
| Working example 58 | Remainder | 0.9 | 1.0 | 0.0001 | 0 | 0.0001 | 0.0004 | Sn, O, Mg, Zn |
| Working example 59 | Remainder | 0.9 | 1.0 | 0.0001 | 0.0001 | 0.0001 | 0.0007 | Sn, O, Mg, Al, Zn |
| Working example 60 | Remainder | 1.0 | 1.0 | 0.0001 | 0 | 0 | 0.0003 | Sn, O, Mg |
| Working example 61 | Remainder | 1.0 | 1.0 | 0.0010 | 0 | 0 | 0.0033 | Sn, O, Mg |
| Working example 62 | Remainder | 1.0 | 1.0 | 0.0050 | 0 | 0 | 0.0167 | Sn, O, Mg |
| Working example 63 | Remainder | 1.0 | 1.0 | 0 | 0.0001 | 0 | 0.0001 | Sn, O, Al |
| Working example 64 | Remainder | 1.0 | 1.0 | 0 | 0.0010 | 0 | 0.0010 | Sn, O, Al |
| Working example 65 | Remainder | 1.0 | 1.0 | 0 | 0.0050 | 0 | 0.0050 | Sn, O, Al |
| Working example 66 | Remainder | 1.0 | 1.0 | 0 | 0 | 0.0001 | 0.0001 | Sn, O, Zn |
| Working example 67 | Remainder | 1.0 | 1.0 | 0 | 0 | 0.0010 | 0.0010 | Sn, O, Zn |
| Working example 68 | Remainder | 1.0 | 1.0 | 0 | 0 | 0.0050 | 0.0050 | Sn, O, Zn |
| Working example 69 | Remainder | 1.0 | 1.0 | 0.0001 | 0.0001 | | 0.0004 | Sn, O, Mg, Al |
| Working example 70 | Remainder | 1.0 | 1.0 | 0.0001 | 0 | 0.0001 | 0.0004 | Sn, O, Mg, Zn |
| Working example 71 | Remainder | 1.0 | 1.0 | 0.0001 | 0.0001 | 0.0001 | 0.0007 | Sn, O, Mg, Al, Zn |
| Working example 72 | Remainder | 1.2 | 0.5 | 0.0001 | 0 | 0 | 0.0003 | Sn, O, Mg |
| Working example 73 | Remainder | 1.5 | 0.5 | 0.0010 | 0 | 0 | 0.0033 | Sn, O, Mg |
| Working example 74 | Remainder | 1.8 | 1.0 | 0.0001 | 0 | 0 | 0.0003 | Sn, O, Mg |
| Working example 75 | Remainder | 1.8 | 1.0 | 0.0010 | 0 | 0 | 0.0033 | Sn, O, Mg |
| Working example 76 | Remainder | 1.8 | 1.0 | 0.0050 | 0 | 0 | 0.0167 | Sn, O, Mg |

TABLE 2-continued

| | | Sn | Ag | Cu | Mg | Al | Zn | Bi | Other |
|---|---|---|---|---|---|---|---|---|---|
| Working example 77 | Remainder | 1.8 | 1.0 | 0 | 0.0001 | 0 | 0.0001 | Sn, O, Al |
| Working example 78 | Remainder | 1.8 | 1.0 | 0 | 0.0010 | 0 | 0.0010 | Sn, O, Al |
| Working example 79 | Remainder | 1.8 | 1.0 | 0 | 0.0050 | 0 | 0.0050 | Sn, O, Al |
| Working example 80 | Remainder | 1.8 | 1.0 | 0 | 0 | 0.0001 | 0.0001 | Sn, O, Zn |
| Working example 81 | Remainder | 1.8 | 1.0 | 0 | 0 | 0.0010 | 0.0010 | Sn, O, Zn |
| Working example 82 | Remainder | 1.8 | 1.0 | 0 | 0 | 0.0050 | 0.0050 | Sn, O, Zn |
| Working example 83 | Remainder | 1.8 | 1.0 | 0.0001 | 0.0001 | | 0.0004 | Sn, O, Mg, Al |
| Working example 84 | Remainder | 1.8 | 1.0 | 0.0001 | 0 | 0.0001 | 0.0004 | Sn, O, Mg, Zn |
| Working example 85 | Remainder | 1.8 | 1.0 | 0.0001 | 0.0001 | 0.0001 | 0.0007 | Sn, O, Mg, Al, Zn |
| Working example 86 | Remainder | 1.9 | 0.5 | 0.0010 | 0 | 0 | 0.0033 | Sn, O, Mg |
| Comparative example 5 | Remainder | 0 | 0.7 | 0 | 0 | 0 | 0.0001 | None |
| Comparative example 6 | Remainder | 3 | 0.5 | 0 | 0 | 0 | 0.0003 | None |
| Comparative example 7 | Remainder | 0.1 | 0.1 | 0 | 0 | 0 | 0.0010 | None |
| Comparative example 8 | Remainder | 1.2 | 0.5 | 0 | 0 | 0.0060 | 0.0050 | None |

| | Melting point (° C.) | Noncrystalline phase thickness (nm) | Occupancy of noncrystalline tin oxide (%) | TCT life (Cycle) | Oxidation on ball surface |
|---|---|---|---|---|---|
| Working example 44 | 227 | 1 | 30 | 300 | ○ |
| Working example 45 | 226 | 2 | 30 | 300 | ○ |
| Working example 46 | 225 | 3 | 30 | 325 | ○ |
| Working example 47 | 224 | 20 | 50 | 375 | ○ |
| Working example 48 | 223 | 1 | 30 | 400 | ○ |
| Working example 49 | 223 | 20 | 50 | 375 | ○ |
| Working example 50 | 223 | 40 | 60 | 350 | ○ |
| Working example 51 | 223 | 2 | 30 | 400 | ○ |
| Working example 52 | 223 | 25 | 50 | 375 | ○ |
| Working example 53 | 223 | 45 | 60 | 350 | Δ |
| Working example 54 | 223 | 3 | 30 | 400 | ○ |
| Working example 55 | 223 | 30 | 50 | 375 | ○ |
| Working example 56 | 223 | 50 | 60 | 350 | Δ |
| Working example 57 | 223 | 3 | 30 | 400 | ○ |
| Working example 58 | 223 | 4 | 30 | 400 | ○ |
| Working example 59 | 223 | 6 | 30 | 400 | ○ |
| Working example 60 | 223 | 1 | 30 | 400 | ○ |
| Working example 61 | 223 | 20 | 50 | 375 | ○ |
| Working example 62 | 223 | 40 | 60 | 350 | ○ |
| Working example 63 | 223 | 2 | 30 | 400 | ○ |
| Working example 64 | 223 | 25 | 50 | 375 | ○ |
| Working example 65 | 223 | 45 | 60 | 350 | Δ |
| Working example 66 | 223 | 3 | 30 | 400 | ○ |
| Working example 67 | 223 | 30 | 50 | 375 | ○ |
| Working example 68 | 223 | 50 | 60 | 350 | Δ |
| Working example 69 | 223 | 3 | 30 | 400 | ○ |
| Working example 70 | 223 | 4 | 30 | 400 | ○ |
| Working example 71 | 223 | 6 | 30 | 400 | ○ |
| Working example 72 | 221 | 1 | 30 | 425 | ○ |
| Working example 73 | 219 | 20 | 50 | 450 | ○ |
| Working example 74 | 219 | 1 | 30 | 450 | ○ |
| Working example 75 | 219 | 20 | 50 | 425 | ○ |
| Working example 76 | 219 | 40 | 60 | 400 | ○ |
| Working example 77 | 219 | 2 | 30 | 450 | ○ |
| Working example 78 | 219 | 25 | 50 | 425 | ○ |
| Working example 79 | 219 | 45 | 60 | 400 | Δ |
| Working example 80 | 219 | 3 | 30 | 450 | ○ |
| Working example 81 | 219 | 30 | 50 | 425 | ○ |
| Working example 82 | 219 | 50 | 60 | 400 | Δ |
| Working example 83 | 219 | 3 | 30 | 450 | ○ |
| Working example 84 | 219 | 4 | 30 | 450 | ○ |
| Working example 85 | 219 | 6 | 30 | 450 | ○ |
| Working example 86 | 219 | 20 | 50 | 450 | ○ |
| Comparative example 5 | 232 | 0 | 0 | 200 | ○ |
| Comparative example 6 | 218 | 0 | 0 | 225 | ○ |
| Comparative example 7 | 227 | 0 | 0 | 250 | ○ |
| Comparative example 8 | 221 | 60 | 20 | 225 | X |

Thermal Fatigue Property at Diameter of 250 μm

TABLE 3

| | Composition (% by mass) | | | | | | Melting point (° C.) | TCT life (Cycle) |
|---|---|---|---|---|---|---|---|---|
| | Sn | Ag | Cu | Mg | Al | Zn | Bi | | |
| Working example 87 | Remainder | 0.1 | 1.2 | 0.0010 | 0 | 0 | 0.0100 | 227 | 675 |
| Working example 88 | Remainder | 0.1 | 1.2 | 0.0010 | 0 | 0 | 1.0000 | 227 | 705 |

TABLE 3-continued

|  | Composition (% by mass) | | | | | | Melting point (° C.) | TCT life (Cycle) |
|---|---|---|---|---|---|---|---|---|
|  | Sn | Ag | Cu | Mg | Al | Zn | Bi | | |
| Working example 89 | Remainder | 0.1 | 1.2 | 0.0010 | 0 | 0 | 2.0000 | 227 | 735 |
| Working example 90 | Remainder | 0.1 | 1.2 | 0.0010 | 0 | 0 | 3.0000 | 227 | 755 |
| Working example 91 | Remainder | 0.1 | 1.2 | 0.0010 | 0 | 0 | 5.0000 | 227 | 775 |
| Working example 92 | Remainder | 1.2 | 1.2 | 0.0010 | 0 | 0 | 0.0100 | 220 | 775 |
| Working example 93 | Remainder | 1.2 | 1.2 | 0.0010 | 0 | 0 | 1.0000 | 220 | 805 |
| Working example 94 | Remainder | 1.2 | 1.2 | 0.0010 | 0 | 0 | 2.0000 | 220 | 835 |
| Working example 95 | Remainder | 1.2 | 1.2 | 0.0010 | 0 | 0 | 3.0000 | 220 | 855 |
| Working example 96 | Remainder | 1.2 | 1.2 | 0.0010 | 0 | 0 | 5.0000 | 220 | 875 |
| Working example 97 | Remainder | 2.0 | 1.0 | 0.0010 | 0 | 0 | 0.0100 | 223 | 825 |
| Working example 98 | Remainder | 2.0 | 1.0 | 0.0010 | 0 | 0 | 1.0000 | 223 | 855 |
| Working example 99 | Remainder | 2.0 | 1.0 | 0.0010 | 0 | 0 | 2.0000 | 223 | 885 |
| Working example 100 | Remainder | 2.0 | 1.0 | 0.0010 | 0 | 0 | 3.0000 | 223 | 905 |
| Working example 101 | Remainder | 2.0 | 1.0 | 0.0010 | 0 | 0 | 5.0000 | 223 | 925 |
| Working example 102 | Remainder | 2.2 | 0.5 | 0.0010 | 0 | 0 | 0.0100 | 219 | 850 |
| Working example 103 | Remainder | 2.2 | 0.5 | 0.0010 | 0 | 0 | 1.0000 | 219 | 880 |
| Working example 104 | Remainder | 2.2 | 0.5 | 0.0010 | 0 | 0 | 2.0000 | 219 | 910 |
| Working example 105 | Remainder | 2.2 | 0.5 | 0.0010 | 0 | 0 | 3.0000 | 219 | 930 |
| Working example 106 | Remainder | 2.2 | 0.5 | 0.0010 | 0 | 0 | 5.0000 | 219 | 950 |
| Working example 107 | Remainder | 2.0 | 1.0 | 0 | 0.0010 | 0 | 0.0100 | 223 | 800 |
| Working example 108 | Remainder | 2.0 | 1.0 | 0 | 0.0010 | 0 | 1.0000 | 223 | 830 |
| Working example 109 | Remainder | 2.0 | 1.0 | 0 | 0.0010 | 0 | 2.0000 | 223 | 860 |
| Working example 110 | Remainder | 2.0 | 1.0 | 0 | 0.0010 | 0 | 3.0000 | 223 | 880 |
| Working example 111 | Remainder | 2.0 | 1.0 | 0 | 0.0010 | 0 | 5.0000 | 223 | 900 |
| Working example 112 | Remainder | 2.0 | 1.0 | 0.0000 | 0 | 0.0010 | 0.0100 | 223 | 800 |
| Working example 113 | Remainder | 2.0 | 1.0 | 0.0000 | 0 | 0.0010 | 1.0000 | 223 | 830 |
| Working example 114 | Remainder | 2.0 | 1.0 | 0.0000 | 0 | 0.0010 | 2.0000 | 223 | 860 |
| Working example 115 | Remainder | 2.0 | 1.0 | 0.0000 | 0 | 0.0010 | 3.0000 | 223 | 880 |
| Working example 116 | Remainder | 2.0 | 1.0 | 0.0000 | 0 | 0.0010 | 5.0000 | 223 | 900 |
| Comparative example 9 | Remainder | 0.1 | 1.2 | 0 | 0 | 0 | 0.0010 | 227 | 475 |
| Comparative example 10 | Remainder | 0.1 | 1.2 | 0 | 0 | 0 | 6.0000 | 227 | 475 |
| Comparative example 11 | Remainder | 1.2 | 0.5 | 0 | 0 | 0 | 1.0000 | 221 | 475 |
| Comparative example 12 | Remainder | 1.2 | 0.5 | 0 | 0 | 0.0060 | 1.0000 | 221 | 425 |

Drop Resistance at Diameter of 250 μm

TABLE 4

|  | Composition (% by mass) | | | | | | | | | |
|---|---|---|---|---|---|---|---|---|---|---|
|  | Sn | Ag | Cu | Mg | Al | Zn | Bi | Ni | P | Sb |
| Working example 30 | Remainder | 2.0 | 1.2 | 0.0010 | 0 | 0 | 0 | 0 | 0 | 0 |
| Working example 117 | Remainder | 2.0 | 1.2 | 0.0010 | 0 | 0 | 0 | 0.0005 | 0 | 0 |
| Working example 118 | Remainder | 2.0 | 1.2 | 0.0010 | 0 | 0 | 0 | 0.0050 | 0 | 0 |
| Working example 119 | Remainder | 2.0 | 1.2 | 0.0010 | 0 | 0 | 0 | 0.0500 | 0 | 0 |
| Working example 120 | Remainder | 2.0 | 1.2 | 0.0010 | 0 | 0 | 0 | 0.5000 | 0 | 0 |
| Working example 121 | Remainder | 2.0 | 1.2 | 0.0010 | 0 | 0 | 0 | 0 | 0.0005 | 0 |
| Working example 122 | Remainder | 2.0 | 1.2 | 0.0010 | 0 | 0 | 0 | 0 | 0.0050 | 0 |
| Working example 123 | Remainder | 2.0 | 1.2 | 0.0010 | 0 | 0 | 0 | 0 | 0.0500 | 0 |
| Working example 124 | Remainder | 2.0 | 1.2 | 0.0010 | 0 | 0 | 0 | 0 | 0.5000 | 0 |
| Working example 125 | Remainder | 2.0 | 1.2 | 0.0010 | 0 | 0 | 0 | 0 | 0 | 0.0005 |
| Working example 126 | Remainder | 2.0 | 1.2 | 0.0010 | 0 | 0 | 0 | 0 | 0 | 0.0050 |
| Working example 127 | Remainder | 2.0 | 1.2 | 0.0010 | 0 | 0 | 0 | 0 | 0 | 0.0500 |
| Working example 128 | Remainder | 2.0 | 1.2 | 0.0010 | 0 | 0 | 0 | 0 | 0 | 0.5000 |
| Working example 129 | Remainder | 2.0 | 1.2 | 0.0010 | 0 | 0 | 0 | 0 | 0 | 0 |
| Working example 130 | Remainder | 2.0 | 1.2 | 0.0010 | 0 | 0 | 0 | 0 | 0 | 0 |
| Working example 131 | Remainder | 2.0 | 1.2 | 0.0010 | 0 | 0 | 0 | 0 | 0 | 0 |
| Working example 132 | Remainder | 2.0 | 1.2 | 0.0010 | 0 | 0 | 0 | 0 | 0 | 0 |
| Working example 133 | Remainder | 2.0 | 1.2 | 0.0010 | 0 | 0 | 0 | 0 | 0 | 0 |
| Working example 134 | Remainder | 2.0 | 1.2 | 0.0010 | 0 | 0 | 0 | 0 | 0 | 0 |
| Working example 135 | Remainder | 2.0 | 1.2 | 0.0010 | 0 | 0 | 0 | 0 | 0 | 0 |
| Working example 136 | Remainder | 2.0 | 1.2 | 0.0010 | 0 | 0 | 0 | 0 | 0 | 0 |
| Working example 137 | Remainder | 2.0 | 1.2 | 0.0010 | 0 | 0 | 0 | 0 | 0 | 0 |
| Working example 138 | Remainder | 2.0 | 1.2 | 0.0010 | 0 | 0 | 0 | 0 | 0 | 0 |
| Working example 139 | Remainder | 2.0 | 1.2 | 0.0010 | 0 | 0 | 0 | 0 | 0 | 0 |
| Working example 140 | Remainder | 2.0 | 1.2 | 0.0010 | 0 | 0 | 0 | 0 | 0 | 0 |
| Working example 141 | Remainder | 2.0 | 1.2 | 0.0010 | 0 | 0 | 0 | 0 | 0 | 0 |
| Working example 142 | Remainder | 2.0 | 1.2 | 0.0010 | 0 | 0 | 0 | 0 | 0 | 0 |
| Working example 143 | Remainder | 2.0 | 1.2 | 0.0010 | 0 | 0 | 0 | 0 | 0 | 0 |
| Working example 144 | Remainder | 2.0 | 1.2 | 0.0010 | 0 | 0 | 0 | 0 | 0 | 0 |
| Working example 145 | Remainder | 2.0 | 1.2 | 0.0010 | 0 | 0 | 0 | 0 | 0 | 0 |
| Working example 146 | Remainder | 2.0 | 1.2 | 0.0010 | 0 | 0 | 0 | 0 | 0 | 0 |

TABLE 4-continued

| | Sn | Ag | Cu | Mg | Al | Zn | Ni | P | Sb |
|---|---|---|---|---|---|---|---|---|---|
| Working example 147 | Remainder | 2.0 | 1.2 | 0.0010 | 0 | 0 | 0 | 0 | 0 | 0 |
| Working example 148 | Remainder | 2.0 | 1.2 | 0.0010 | 0 | 0 | 0 | 0 | 0 | 0 |
| Working example 149 | Remainder | 2.0 | 1.2 | 0.0010 | 0 | 0 | 0 | 0.0002 | 0.0002 | 0 |
| Working example 150 | Remainder | 2.0 | 1.2 | 0.0010 | 0 | 0 | 0 | 0.0500 | 0 | 0.3000 |
| Working example 151 | Remainder | 2.0 | 1.2 | 0.0010 | 0 | 0 | 0 | 0 | 0.1000 | 0.1000 |
| Working example 152 | Remainder | 2.0 | 1.2 | 0.0010 | 0 | 0 | 1.0000 | 0 | 0.1000 | 0.1000 |
| Working example 31 | Remainder | 2.2 | 1.5 | 0.0001 | 0 | 0 | 0 | 0 | 0 | 0 |
| Working example 32 | Remainder | 2.2 | 1.5 | 0.0010 | 0 | 0 | 0 | 0 | 0 | 0 |
| Working example 33 | Remainder | 2.2 | 1.5 | 0.0050 | 0 | 0 | 0 | 0 | 0 | 0 |
| Comparative example 5 | Remainder | 0 | 0.7 | 0 | 0 | 0 | 0 | 0 | 0 | 0 |
| Comparative example 6 | Remainder | 3 | 0.5 | 0 | 0 | 0 | 0 | 0 | 0 | 0 |
| Comparative example 7 | Remainder | 0.1 | 0.1 | 0 | 0 | 0 | 0 | 0 | 0 | 0 |
| Comparative example 8 | Remainder | 1.2 | 0.5 | 0 | 0 | 0.0060 | 0 | 0 | 0 | 0 |

| | Composition (% by mass) | | | | | Melting point (°C.) | Drop impact life (Cycle) |
|---|---|---|---|---|---|---|---|
| | Ce | La | Co | Fe | In | | |
| Working example 30 | 0 | 0 | 0 | 0 | 0 | 223 | 105 |
| Working example 117 | 0 | 0 | 0 | 0 | 0 | 223 | 140 |
| Working example 118 | 0 | 0 | 0 | 0 | 0 | 223 | 150 |
| Working example 119 | 0 | 0 | 0 | 0 | 0 | 223 | 165 |
| Working example 120 | 0 | 0 | 0 | 0 | 0 | 223 | 170 |
| Working example 121 | 0 | 0 | 0 | 0 | 0 | 223 | 110 |
| Working example 122 | 0 | 0 | 0 | 0 | 0 | 223 | 120 |
| Working example 123 | 0 | 0 | 0 | 0 | 0 | 223 | 140 |
| Working example 124 | 0 | 0 | 0 | 0 | 0 | 223 | 150 |
| Working example 125 | 0 | 0 | 0 | 0 | 0 | 223 | 130 |
| Working example 126 | 0 | 0 | 0 | 0 | 0 | 223 | 140 |
| Working example 127 | 0 | 0 | 0 | 0 | 0 | 223 | 160 |
| Working example 128 | 0 | 0 | 0 | 0 | 0 | 223 | 170 |
| Working example 129 | 0.0005 | 0 | 0 | 0 | 0 | 223 | 110 |
| Working example 130 | 0.0050 | 0 | 0 | 0 | 0 | 223 | 120 |
| Working example 131 | 0.0500 | 0 | 0 | 0 | 0 | 223 | 140 |
| Working example 132 | 0.5000 | 0 | 0 | 0 | 0 | 223 | 150 |
| Working example 133 | 0 | 0.0005 | 0 | 0 | 0 | 223 | 110 |
| Working example 134 | 0 | 0.0050 | 0 | 0 | 0 | 223 | 120 |
| Working example 135 | 0 | 0.0500 | 0 | 0 | 0 | 223 | 140 |
| Working example 136 | 0 | 0.5000 | 0 | 0 | 0 | 223 | 150 |
| Working example 137 | 0 | 0 | 0.0005 | 0 | 0 | 223 | 110 |
| Working example 138 | 0 | 0 | 0.0050 | 0 | 0 | 223 | 120 |
| Working example 139 | 0 | 0 | 0.0500 | 0 | 0 | 223 | 140 |
| Working example 140 | 0 | 0 | 0.5000 | 0 | 0 | 223 | 150 |
| Working example 141 | 0 | 0 | 0 | 0.0005 | 0 | 223 | 130 |
| Working example 142 | 0 | 0 | 0 | 0.0050 | 0 | 223 | 140 |
| Working example 143 | 0 | 0 | 0 | 0.0500 | 0 | 223 | 160 |
| Working example 144 | 0 | 0 | 0 | 0.5000 | 0 | 223 | 170 |
| Working example 145 | 0 | 0 | 0 | 0 | 0.0005 | 223 | 120 |
| Working example 146 | 0 | 0 | 0 | 0 | 0.0050 | 223 | 130 |
| Working example 147 | 0 | 0 | 0 | 0 | 0.0500 | 223 | 150 |
| Working example 148 | 0 | 0 | 0 | 0 | 0.5000 | 223 | 160 |
| Working example 149 | 0 | 0 | 0 | 0.0001 | 0 | 223 | 120 |
| Working example 150 | 0.0500 | 0.0500 | 0 | 0 | 0.0500 | 223 | 170 |
| Working example 151 | 0.1000 | 0.1000 | 0.1000 | 0 | 0 | 230 | 103 |
| Working example 152 | 0.1000 | 0.1000 | 0.1000 | 0 | 0 | 230 | 103 |
| Working example 31 | 0 | 0 | 0 | 0 | 0 | 219 | 102 |
| Working example 32 | 0 | 0 | 0 | 0 | 0 | 219 | 101 |
| Working example 33 | 0 | 0 | 0 | 0 | 0 | 219 | 100 |
| Comparative example 5 | 0 | 0 | 0 | 0 | 0 | 232 | 80 |
| Comparative example 6 | 0 | 0 | 0 | 0 | 0 | 218 | 40 |
| Comparative example 7 | 0 | 0 | 0 | 0 | 0 | 227 | 85 |
| Comparative example 8 | 0 | 0 | 0 | 0 | 0 | 221 | 75 |

Drop Resistance at Diameter of 180 μm

TABLE 5

| | Composition (% by mass) | | | | | | | | |
|---|---|---|---|---|---|---|---|---|---|
| | Sn | Ag | Cu | Mg | Al | Zn | Ni | P | Sb |
| Working example 49 | Remainder | 0.9 | 1.0 | 0.0010 | 0 | 0 | 0 | 0 | 0 |
| Working example 153 | Remainder | 0.9 | 1.0 | 0.0010 | 0 | 0 | 0.0005 | 0 | 0 |
| Working example 154 | Remainder | 0.9 | 1.0 | 0.0010 | 0 | 0 | 0.0050 | 0 | 0 |
| Working example 155 | Remainder | 0.9 | 1.0 | 0.0010 | 0 | 0 | 0.0500 | 0 | 0 |
| Working example 156 | Remainder | 0.9 | 1.0 | 0.0010 | 0 | 0 | 0.5000 | 0 | 0 |
| Working example 157 | Remainder | 0.9 | 1.0 | 0.0010 | 0 | 0 | 0 | 0.0005 | 0 |

TABLE 5-continued

| | | | | | | | | | |
|---|---|---|---|---|---|---|---|---|---|
| Working example 158 | Remainder | 0.9 | 1.0 | 0.0010 | 0 | 0 | 0 | 0.0050 | 0 |
| Working example 159 | Remainder | 0.9 | 1.0 | 0.0010 | 0 | 0 | 0 | 0.0500 | 0 |
| Working example 160 | Remainder | 0.9 | 1.0 | 0.0010 | 0 | 0 | 0 | 0.5000 | 0 |
| Working example 161 | Remainder | 0.9 | 1.0 | 0.0010 | 0 | 0 | 0 | 0 | 0.0005 |
| Working example 162 | Remainder | 0.9 | 1.0 | 0.0010 | 0 | 0 | 0 | 0 | 0.0050 |
| Working example 163 | Remainder | 0.9 | 1.0 | 0.0010 | 0 | 0 | 0 | 0 | 0.0500 |
| Working example 164 | Remainder | 0.9 | 1.0 | 0.0010 | 0 | 0 | 0 | 0 | 0.5000 |
| Working example 165 | Remainder | 0.9 | 1.0 | 0.0010 | 0 | 0 | 0 | 0 | 0 |
| Working example 166 | Remainder | 0.9 | 1.0 | 0.0010 | 0 | 0 | 0 | 0 | 0 |
| Working example 167 | Remainder | 0.9 | 1.0 | 0.0010 | 0 | 0 | 0 | 0 | 0 |
| Working example 168 | Remainder | 0.9 | 1.0 | 0.0010 | 0 | 0 | 0 | 0 | 0 |
| Working example 169 | Remainder | 0.9 | 1.0 | 0.0010 | 0 | 0 | 0 | 0 | 0 |
| Working example 170 | Remainder | 0.9 | 1.0 | 0.0010 | 0 | 0 | 0 | 0 | 0 |
| Working example 171 | Remainder | 0.9 | 1.0 | 0.0010 | 0 | 0 | 0 | 0 | 0 |
| Working example 172 | Remainder | 0.9 | 1.0 | 0.0010 | 0 | 0 | 0 | 0 | 0 |
| Working example 173 | Remainder | 0.9 | 1.0 | 0.0010 | 0 | 0 | 0 | 0 | 0 |
| Working example 174 | Remainder | 0.9 | 1.0 | 0.0010 | 0 | 0 | 0 | 0 | 0 |
| Working example 175 | Remainder | 0.9 | 1.0 | 0.0010 | 0 | 0 | 0 | 0 | 0 |
| Working example 176 | Remainder | 0.9 | 1.0 | 0.0010 | 0 | 0 | 0 | 0 | 0 |
| Working example 177 | Remainder | 0.9 | 1.0 | 0.0010 | 0 | 0 | 0 | 0 | 0 |
| Working example 178 | Remainder | 0.9 | 1.0 | 0.0010 | 0 | 0 | 0 | 0 | 0 |
| Working example 179 | Remainder | 0.9 | 1.0 | 0.0010 | 0 | 0 | 0 | 0 | 0 |
| Working example 180 | Remainder | 0.9 | 1.0 | 0.0010 | 0 | 0 | 0 | 0 | 0 |
| Working example 181 | Remainder | 0.9 | 1.0 | 0.0010 | 0 | 0 | 0 | 0 | 0 |
| Working example 182 | Remainder | 0.9 | 1.0 | 0.0010 | 0 | 0 | 0 | 0 | 0 |
| Working example 183 | Remainder | 0.9 | 1.0 | 0.0010 | 0 | 0 | 0 | 0 | 0 |
| Working example 184 | Remainder | 0.9 | 1.0 | 0.0010 | 0 | 0 | 0 | 0 | 0 |
| Working example 185 | Remainder | 0.9 | 1.0 | 0.0010 | 0 | 0 | 0.0002 | 0.0002 | 0 |
| Working example 186 | Remainder | 0.9 | 1.0 | 0.0010 | 0 | 0 | 0.0500 | 0 | 0.3000 |
| Working example 187 | Remainder | 0.9 | 1.0 | 0.0010 | 0 | 0 | 0 | 0.1000 | 0.1000 |
| Working example 74 | Remainder | 1.8 | 1.0 | 0.0001 | 0 | 0 | 0 | 0 | 0 |
| Working example 75 | Remainder | 1.8 | 1.0 | 0.0010 | 0 | 0 | 0 | 0 | 0 |
| Working example 76 | Remainder | 1.8 | 1.0 | 0.0050 | 0 | 0 | 0 | 0 | 0 |
| Comparative example 5 | Remainder | 0 | 0.7 | 0 | 0 | 0 | 0 | 0 | 0 |
| Comparative example 6 | Remainder | 3 | 0.5 | 0 | 0 | 0 | 0 | 0 | 0 |
| Comparative example 7 | Remainder | 0.1 | 0.1 | 0 | 0 | 0 | 0 | 0 | 0 |
| Comparative example 8 | Remainder | 1.2 | 0.5 | 0 | 0 | 0.0060 | 0 | 0 | 0 |

| | Composition (% by mass) | | | | | Melting point | Drop impact life |
|---|---|---|---|---|---|---|---|
| | Ce | La | Co | Fe | In | (° C.) | (Cycle) |
| Working example 49 | 0 | 0 | 0 | 0 | 0 | 223 | 95 |
| Working example 153 | 0 | 0 | 0 | 0 | 0 | 223 | 130 |
| Working example 154 | 0 | 0 | 0 | 0 | 0 | 223 | 140 |
| Working example 155 | 0 | 0 | 0 | 0 | 0 | 223 | 155 |
| Working example 156 | 0 | 0 | 0 | 0 | 0 | 223 | 160 |
| Working example 157 | 0 | 0 | 0 | 0 | 0 | 223 | 100 |
| Working example 158 | 0 | 0 | 0 | 0 | 0 | 223 | 110 |
| Working example 159 | 0 | 0 | 0 | 0 | 0 | 223 | 130 |
| Working example 160 | 0 | 0 | 0 | 0 | 0 | 223 | 140 |
| Working example 161 | 0 | 0 | 0 | 0 | 0 | 223 | 120 |
| Working example 162 | 0 | 0 | 0 | 0 | 0 | 223 | 130 |
| Working example 163 | 0 | 0 | 0 | 0 | 0 | 223 | 150 |
| Working example 164 | 0 | 0 | 0 | 0 | 0 | 223 | 160 |
| Working example 165 | 0.0005 | 0 | 0 | 0 | 0 | 223 | 100 |
| Working example 166 | 0.0050 | 0 | 0 | 0 | 0 | 223 | 110 |
| Working example 167 | 0.0500 | 0 | 0 | 0 | 0 | 223 | 130 |
| Working example 168 | 0.5000 | 0 | 0 | 0 | 0 | 223 | 140 |
| Working example 169 | 0 | 0.0005 | 0 | 0 | 0 | 223 | 100 |
| Working example 170 | 0 | 0.0050 | 0 | 0 | 0 | 223 | 110 |
| Working example 171 | 0 | 0.0500 | 0 | 0 | 0 | 223 | 130 |
| Working example 172 | 0 | 0.5000 | 0 | 0 | 0 | 223 | 140 |
| Working example 173 | 0 | 0 | 0.0005 | 0 | 0 | 223 | 100 |
| Working example 174 | 0 | 0 | 0.0050 | 0 | 0 | 223 | 110 |
| Working example 175 | 0 | 0 | 0.0500 | 0 | 0 | 223 | 130 |
| Working example 176 | 0 | 0 | 0.5000 | 0 | 0 | 223 | 140 |
| Working example 177 | 0 | 0 | 0 | 0.0005 | 0 | 223 | 120 |
| Working example 178 | 0 | 0 | 0 | 0.0050 | 0 | 223 | 130 |
| Working example 179 | 0 | 0 | 0 | 0.0500 | 0 | 223 | 150 |
| Working example 180 | 0 | 0 | 0 | 0.5000 | 0 | 223 | 160 |
| Working example 181 | 0 | 0 | 0 | 0 | 0.0005 | 223 | 110 |
| Working example 182 | 0 | 0 | 0 | 0 | 0.0050 | 223 | 120 |
| Working example 183 | 0 | 0 | 0 | 0 | 0.0500 | 223 | 140 |
| Working example 184 | 0 | 0 | 0 | 0 | 0.5000 | 223 | 150 |
| Working example 185 | 0 | 0 | 0 | 0.0001 | 0 | 223 | 110 |
| Working example 186 | 0.0500 | 0.0500 | 0 | 0 | 0.0500 | 223 | 160 |
| Working example 187 | 0.1000 | 0.1000 | 0.1000 | 0 | 0 | 230 | 93 |
| Working example 74 | 0 | 0 | 0 | 0 | 0 | 219 | 92 |

TABLE 5-continued

| | | | | | | | |
|---|---|---|---|---|---|---|---|
| Working example 75 | 0 | 0 | 0 | 0 | 0 | 219 | 91 |
| Working example 76 | 0 | 0 | 0 | 0 | 0 | 219 | 90 |
| Comparative example 5 | 0 | 0 | 0 | 0 | 0 | 232 | 70 |
| Comparative example 6 | 0 | 0 | 0 | 0 | 0 | 218 | 30 |
| Comparative example 7 | 0 | 0 | 0 | 0 | 0 | 227 | 75 |
| Comparative example 8 | 0 | 0 | 0 | 0 | 0 | 221 | 65 |

Pull Strength and Presence of Peel Failure After Performing Multi-Time Reflow Test at Diameter of 250 μm

TABLE 6

| | Composition (% by mass) | | | | | | Pull strength (mN) | Peel surface |
|---|---|---|---|---|---|---|---|---|
| | Sn | Ag | Cu | Mg | Al | Zn | Ni | | |
| Working example 30 | Remainder | 2.0 | 1.2 | 0.0010 | 0 | 0 | 0 | 4170 | Δ |
| Working example 117 | Remainder | 2.0 | 1.2 | 0.0010 | 0 | 0 | 0.0005 | 4360 | ○ |
| Working example 118 | Remainder | 2.0 | 1.2 | 0.0010 | 0 | 0 | 0.0050 | 4380 | ○ |
| Working example 119 | Remainder | 2.0 | 1.2 | 0.0010 | 0 | 0 | 0.0500 | 4390 | ○ |
| Working example 120 | Remainder | 2.0 | 1.2 | 0.0010 | 0 | 0 | 0.5000 | 4400 | ○ |
| Comparative example 5 | Remainder | 0 | 0.7 | 0 | 0 | 0 | 0 | 3510 | X |
| Comparative example 6 | Remainder | 3 | 0.5 | 0 | 0 | 0 | 0 | 3810 | X |
| Comparative example 7 | Remainder | 0.1 | 0.1 | 0 | 0 | 0 | 0 | 3640 | X |
| Comparative example 8 | Remainder | 1.2 | 0.5 | 0 | 0 | 0.0060 | 0 | 3870 | X |

As shown in Table 1 and according to the present working examples, even the solder balls having the small diameter of 250 μm exhibited favorable thermal fatigue properties enduring not less than 500 cycles. Further, as shown in Table 2 and according to the present working examples, even the solder balls having the small diameter of 180 μm exhibited favorable thermal fatigue properties enduring not less than 300 cycles. Furthermore, as shown in Table 3 and according to the present working examples, even the solder balls having the small diameter of 250 μm exhibited favorable thermal fatigue properties enduring not less than 675 cycles. Similarly, as shown in Table 4 and according to the present working examples, the solder balls having the small diameter of 250 μm also exhibited favorable drop resistances enduring not less than 90 cycles. Further, as shown in Table 5 and according to the present working examples, the solder balls having the small diameter of 180 μm also exhibited favorable drop resistances enduring not less than 90 cycles. Furthermore, as shown in Table 6 and according to the present working examples in which both Ni and Mg were added, there could be achieved favorable pull strengths and peel interfaces even after performing the multi-time reflow test.

The invention claimed is:

1. A solder ball for semiconductor packaging made of a solder alloy containing:
   Sn as a main element;
   0.1-2.5% Ag by mass;
   0.1-1.5% Cu by mass; and
   at least one of Mg and Zn in a total amount of 0.0001-0.005% by mass, wherein said solder ball includes a surface comprising a noncrystalline phase of a thickness of 1-50 nm, said noncrystalline phase containing: at least one of Mg and Zn; O; and Sn.

2. The solder ball for semiconductor packaging according to claim 1, wherein said solder alloy contains Ag in a concentration of 0.5-1.9% by mass.

3. The solder ball for semiconductor packaging according to claim 1, wherein said solder alloy further contains 0.01-5% by mass of Bi.

4. The solder ball for semiconductor packaging according to claim 1, wherein said solder alloy further contains at least one of Ni, P, Sb, Ce, La, Co, Fe and In in a total amount of 0.0005 to 0.5% by mass.

5. An electronic member comprising:
   solder-bonded sections, wherein at least one of said solder-bonded sections is formed using the solder ball for semiconductor packaging according to claim 1.

6. A solder ball for semiconductor packaging made of a solder alloy containing:
   Sn as a main element;
   0.1-1.9% Ag by mass;
   0.1-1.0% Cu by mass; and
   at least one of Mg and Zn in a total amount of 0.0001-0.005% by mass, wherein said solder ball includes a surface comprising a noncrystalline phase of a thickness of 1-50 nm, said noncrystalline phase containing: at least one of Mg and Zn; O; and Sn.

7. The solder ball for semiconductor packaging according to claim 6, wherein said solder alloy contains Ag in a concentration of 0.5-1.9% by mass.

8. The solder ball for semiconductor packaging according to claim 6, wherein said solder alloy further contains 0.01-5% by mass of Bi.

9. The solder ball for semiconductor packaging according to claim 6, wherein said solder alloy further contains at least one of Ni, P, Sb, Ce, La, Co, Fe and In in a total amount of 0.0005 to 0.5% by mass.

10. An electronic member comprising:
    solder-bonded sections, wherein at least one of said solder-bonded sections is formed using the solder ball for semiconductor packaging according to claim 6.

* * * * *